(12) United States Patent
Shen

(10) Patent No.: US 6,674,684 B1
(45) Date of Patent: Jan. 6, 2004

(54) MULTI-BANK CHIP COMPATIBLE WITH A CONTROLLER DESIGNED FOR A LESSER NUMBER OF BANKS AND METHOD OF OPERATING

(75) Inventor: William Wu Shen, Los Altos, CA (US)

(73) Assignee: Infineon Technologies North America Corp., San Jose, CA (US)

( * ) Notice: Subject to any disclaimer, the term of this patent is extended or adjusted under 35 U.S.C. 154(b) by 0 days.

(21) Appl. No.: 10/460,791

(22) Filed: Jun. 11, 2003

(51) Int. Cl.[7] .................................................. G11C 8/12
(52) U.S. Cl. ............................. 365/230.03; 365/230.08; 365/230.06; 365/230.02
(58) Field of Search ....................... 365/230.03, 230.08, 365/230.06, 230.02, 233

(56) References Cited

FOREIGN PATENT DOCUMENTS

| JP | 62-99875 | * 5/1987 | ............ G06F/15/64 |
|----|----------|----------|------------------------|
| JP | 11-339469 | * 12/1999 | ............ G11C/11/406 |
| JP | 2001-93279 | * 4/2001 | ............ G11C/11/407 |

* cited by examiner

Primary Examiner—Andrew Q. Tran
(74) Attorney, Agent, or Firm—Darby & Darby

(57) ABSTRACT

A memory chip and a method of operating a chip with a number of banks of memory to be backward compatible with a controller designed to operate a chip having a lesser number of banks. To accomplish this, a control (bit) is produced on the chip Mode Register Set (MRS) that activates corresponding logic in the chip to move one of the bits used to address a memory cell, such as one of the row address bits, to a position of the bank ID field. This provides a greater number of bank ID bits to select memory banks of a chip so that a high number bank chip can accept a command supplied by a controller designed to operate a chip with a fewer number of banks and that has a format of a lesser number of bank ID bits.

9 Claims, 4 Drawing Sheets

MULTI-BANK CHIP COMPATIBLE WITH A CONTROLLER DESIGNED FOR A LESSER NUMBER OF BANKS AND METHOD OF OPERATING

FIELD OF THE INVENTION

The invention relates to a multi-bank memory chip that can operate with a controller designed for controlling a chip having a lesser number of banks and a method of operating such a chip.

BACKGROUND OF THE INVENTION

Use of Dynamic Random Access Memory (DRAM) chips is well known in the computer field. Each memory chip contains at least one bank of a plurality of memory cells arranged in a row and column array. Each cell can contain a number of data bits. As memory technology has advanced, the capacity of chips has increased. For example, present day Synchronous DRAM (SDRAM) memory chips have a plurality of internal banks of the memory cells, for example, four or eight, with each bank having the row and column array of the memory cells. An individual cell of a memory bank of a multi-bank chip is addressed for purposes of reading or writing data by first selecting the memory bank and then addressing the row and column of the cell in the selected bank. The addressing is accomplished by a memory controller external of the chip that is often located on a computer system board, such as the mother board of a personal computer.

SDRAM chip internal banks of memory are separate entities. This allows the memory controller to operate multiple read/write requests at the same time with each request addressing a selected bank. When addressing a memory cell of a particular memory bank of the chip, the memory controller must produce bank identification, "bank ID", bits with each memory command/address so that the chip will know the memory bank for which the address and commands are intended.

An SDRAM chip has an on-chip mode register which is programmed by the external controller with the bank selection (bank ID) bits and the cell address and commands. The set of address/command bits supplied to the chip mode register is often referred to as a "Mode Register Set" (MRS). The details of the MRS bits, such as read and write commands, burst length and burst type used to execute various functions for different types of chips, such as DRAMs, is well known in the art and only the chip functions needed to describe the invention are presented here.

As an example to aid in the explanation of the invention, consider a chip of 1 Gb capacity that has four memory banks. To read data from a memory cell of one bank of the chip, two commands are needed. The format of the command and address of the chip MRS is represented as follows:

The legends used in the Chart above, which are relatively conventional, are explained below together with other explanatory material relative to the particular chip being considered.

CKE—activates the system CLK (clock) signal when high (H) and deactivates the CLK signal when low (L). This can be used to initiate either a Power Down mode, Suspend mode or Self Refresh mode.

CS—enables the command decoder when low (L) and disables the command decoder when high (H). When the command decoder is disabled, new commands are ignored but previous operations continue.

A0–A15—the bits of the address bus. SDRAM breaks down the memory array address into ROW and Column addresses, and these addresses are sent by multiplex ROW and Column address at different times on the address bus. For example, a 512 Mb chip will have bits A0–A13 for ROW address bits and A0–A9, A11 for Column address bits.

RAS—row address select. During a Bank Active command cycle, Address bits A0–A12 define the row address (RA0–RA12) when sampled at the rising clock edge.

CAS—column address select. Bits A0–A9 and A11–A15. The number of bits of the Column address depends upon the number of memory cells activated by the Row address bits. As conventional, as the capacity of DRAM chips becomes larger, the size of each row stays relatively constant due to memory power consideration. Therefore, the column address usually has fewer bits than a ROW address.

WE—write enable. When active, indicates the write operation to the Column memory cell addressed.

BA—bank address field. A four bank DRAM chip MRS has two bank ID bits BA0, BA1 to select to which of the four banks a command applies. An eight bank chip would have three bank ID bits BA0, BA1, BA2.

A10(=AP)—is used to invoke the autoprecharge operation at the end of the burst read or write cycle. If A10 is high, autoprecharge is selected and the bank ID bits BA0, BA1 define the bank to be precharged. If A10 is low, autoprecharge is disabled. During a precharge command cycle, A10 (=AP) is used in conjunction with the bank ID bits BA0 and BA1 to control which bank(s) to precharge. If A10 is high, all four banks will be precharged regardless of the state of BA0 and BA1. If A10 is low, then BA0 and BA1 are used to define which bank to precharge.

FIG. 1 shows part of a typical four bank chip 10, such as found in a DDR2 512 Mb chip. Only the parts of the chip address logic and circuits pertinent to the invention are shown. The read and write functions are standard and are omitted. The chip 10 is operated by an external controller 60. Chip 10 has four memory banks, 12-0, 12-1, 12-2 and 12-3, each bank having a plurality of memory cells arranged in rows and columns. The cell of a memory bank 12 is addressed by instructions supplied by an external controller 60. That is, the controller 60 is not part of the chip and is

CHART A

| Function | CKE | CS | RAS | CAS | WE | BA0 BA1 | A15-A11 | A10 | A9-A0 |
|---|---|---|---|---|---|---|---|---|---|
| Bank Active | H | L | L | H | H | Bank Address | Row Address | | |
| Read with Auto Pre-charge | H | L | H | L | H | Bank Address | Column Address | H | Column Address | typically located in another part of the computer in which the chip 10 is being used. Each memory bank 12 has corresponding sense amplifiers 13 and outputs to an input/output (I/O) gating mask logic circuit 15. All of this is conventional.

The controller 60 produces instructions for only two bank ID bits, BA0 and BA1. Thus, it is designed to operate with a chip in which there are no more than four memory banks 12. Signals, such as those referred to in Chart A above, are applied as instructions from the external controller 60 to a chip control logic circuit 20 that includes a command decoder 22 that decodes the instructions from the controller 60. There is also an address register 30 to which the address bits A0–A12 and the two bank ID bits BA0 and BA1 are input and stored.

The bank select ID bits BA0 and BA1 from the address register 30 are applied to a bank control logic circuit 34 to determine which of the four banks 12-0, 12-1, 12-2 and 12-3 is to be selected for a read or write operation. Depending upon which one of the four banks that is selected, a corresponding bank row decoder 40-1, 40-1, 40-2 and 40-3, as well as a corresponding bank column decoder 42-0, 42-1, 42-2 and 42-3 also is selected. To address a memory cell of the selected bank 12-0 to 12-3, the RAS (row address select) address bits A0–A12 are appropriately applied to a row address multiplexer 44. Next, the CAS (column address select) bits A0–A9, A11 and A12 are applied to a column address counter and latch circuit 46. There is also a refresh circuit 48 that recharges the chip memory cell transistors (at AP=A10). Read and write operations are performed on the selected cell of a bank by selecting one of the four banks 12-0 to 12-3 by using the two bank ID bits BA0, BA1 and the column and row addresses.

Charts B1 and B2 show certain of the details of two different size chips. Chart B1 illustrates a four bank 512 Mb chip with the bank ID bits BA0 and BA1. The autoprecharge occurs at $A_{10}$, with the row address RAS being from A0–A13 and the column address CAS being at A0–A9, A11. Chart B2 illustrates a four bank chip of 1 Gb capacity. Therefore, it has one additional bit A0–A14 for the row address.

| 512 Mb Chart B1 | |
|---|---|
| Configuration | 128 Mb × 4 |
| # of Banks | 4 |
| Bank ID | BA0, BA1 |
| Auto precharge | $A_{10}$/AP |
| Row Address | $A_0$–$A_{13}$ |
| Column Address | $A_0$–$A_9$, $A_{11}$ |

| 1 Gb Chart B2 | |
|---|---|
| Configuration | 256 Mb × 4 |
| # of Banks | 4 |
| Bank ID | BA0, BA1 |
| Auto precharge | $A_{10}$/AP |
| Row Address | $A_0$–$A_{14}$ |
| Column Address | $A_0$–$A_9$, $A_{11}$ |

As the number of memory banks of a chip increases the external memory controller must accommodate this. This means that extra logic and IO (input/output) support must be provided for the bank Id BA field. For example, if the chip has more than four banks of memory, the size of the bank ID field must increase. As should be obvious, if the memory controller outputs instructions for two bank ID bits for bank selection, it can select any one of four banks on a chip. If the memory controller outputs instructions for three bank ID bits, it can select one of up to eight banks on a chip. The latter is shown on Chart B2-1.

| 1 Gb Chart B2-1 | |
|---|---|
| Configuration | 256 Mb × 4 |
| # of Banks | 8 |
| Bank ID | BA0, BA1, BA2 |
| Auto precharge | $A_{10}$/AP |
| Row Address | $A_0$–$A_{13}$ |
| Column Address | $A_0$–$A_9$, $A_{11}$ |

A problem arises when chips with a large number of banks, for example eight, are to be used with memory controllers that were designed to operate with chips having a fewer number of banks, for example, four. Such a controller would only be capable of producing two bank ID bits BA0 and BA1. Therefore, it would be desirable to provide a solution to a problem of "backward compatibility" so that an existing controller, such as one designed to operate with chips having four memory banks, can operate a chip with a higher number of banks, such as eight banks. Accordingly, a need exists to be able to operate a chip having a given number of memory banks by a controller designed to operate a chip with a fewer number of banks.

BRIEF DESCRIPTION OF THE INVENTION

The invention provides for configuring and operating a chip with a number of banks of memory to be backward compatible with controllers designed to operate chips having a lesser number of banks. The invention accomplishes this by providing an optional control (bit) on the chip Mode Register Set (MRS). The use of this control activates corresponding logic in the chip to move one of the bits used to address a memory cell, such as one of the row address bits, to a position of the bank ID field. This provides a greater number of bank ID bits to select memory banks of a chip. Therefore, in accordance with the invention, a high number bank chip can accept a command supplied by a controller designed to operate a chip with a fewer number of banks and has a format of a fewer bank ID bits.

In accordance with the invention, for example, consider an SDRAM chip with eight banks that is operated by a controller designed to operate chips having four banks. One bit of the chip MRS is used as a control to designate the chip as being either in the lower number, e.g., four bank mode, or the higher number, e.g., eight bank mode. When the chip is operated in the higher bank number mode by an external controller designed for this, such as a controller producing instructions for three bank ID bits which can select one of eight banks, all three bits of the bank address register and all row or column addresses are operated in the normal manner. In the lower bank number mode, only two bank ID bits come from the external control, which is a memory controller which only supports four bank operations. In this case, the chip will use one of the address as the third bank ID bit and apply the complete three bit bank ID for both the RAS and corresponding CAS operations to select one of the eight banks. In a preferred embodiment of the invention, any row address bit can be used as this third bank ID bit.

This invention is described with reference to an SDRAM type chip but is applicable with various memory chips, such as SDRAM, DDR1 SDRAM and DDR2 SDRAM, as well as any further DRAM architecture with multiple internal banks structure where the bank numbers are different.

BRIEF DESCRIPTION OF THE DRAWINGS

Other objects and advantages of the present invention will become more apparent upon reference to the following specification and annexed drawings in which.

DETAILED DESCRIPTION OF THE INVENTION

In connection with a preferred embodiment of the invention, consider operating a high number bank chip, for example one having eight banks, by a controller designed for a chip with a lesser number of banks, for example, a four bank controller that produces instructions for only two bank ID bits BA0, BA1. As described below, the chip picks up an address bit, for example, the A14 row address bit in a 1 Gb size four bank chip, at Active, row address select (RAS) time. This bit is stored such as by a latch type circuit for use as the bank ID BA2 bit. The A14 bit that is picked up from the RAS and is to be used as an internal BA2 bit, along with the normal bank ID bits BA0 and BA1 for that RAS operation, as well as the corresponding subsequent Column READ/WRITE operation(s) and precharge operation, on that "activated" row. The particular address bit A . . . An of the ROW address to be used for the BA2 bit can be selected as desired.

Figure 1:
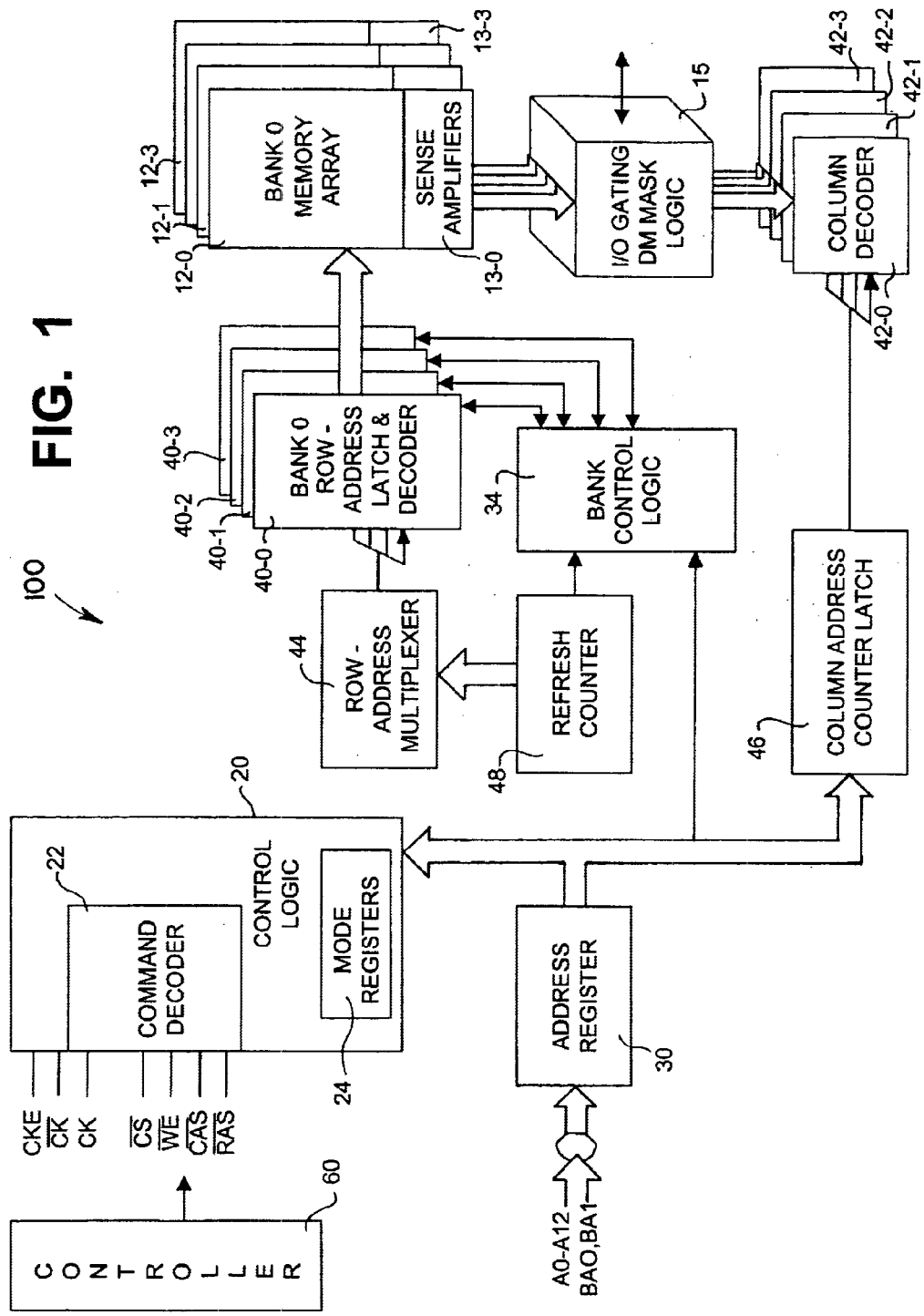
FIG. 1 is a schematic diagram of a portion of a four bank memory chip operated by a four bank controller.
Figure 2:
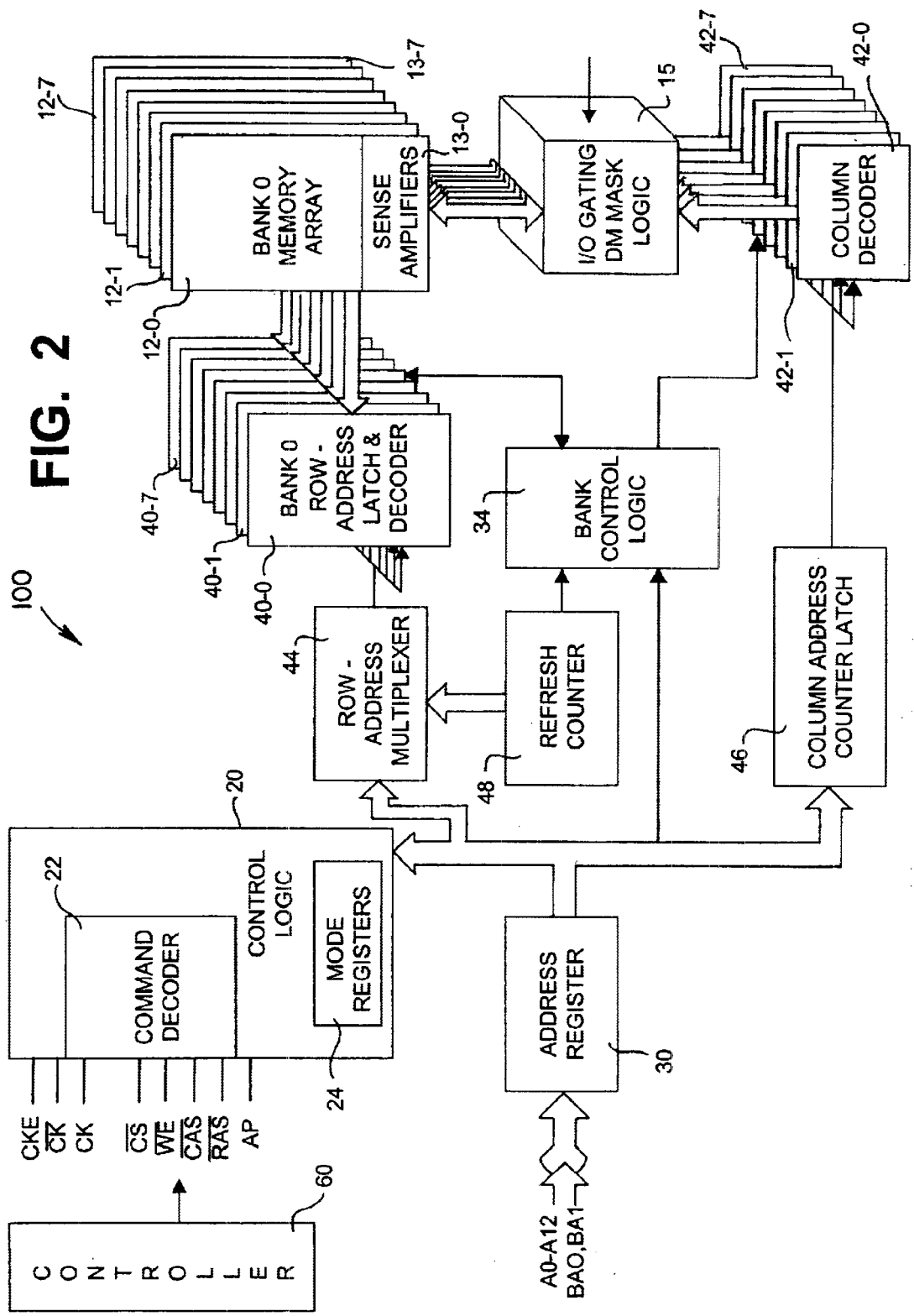
FIG. 2 is a schematic diagram of a memory chip with eight banks.

FIG. 2 is a schematic diagram of a part of a memory chip 100 that has eight memory banks 12-0 through 12-7 as compared to the four banks 12-0 through 12-3 of the chip 10 of FIG. 1. There are eight corresponding row address decoders and latches 40-0 through 40-7 as well as eight column address decoders 42-0 through 42-7 for the banks. The other circuit elements of FIG. 2 correspond to those of FIG. 1.

If the eight bank chip 100 is operated by an eight bank controller (not shown), then there would be three bank ID bits BA0, BA1 and BA2 in the MRS. That is, when operating with an eight bank controller, the chip operates in the normal manner in that the chip MRS receives the three bit bank ID which has three bits BA0, BA1 and BA2, as well as row or column addresses. In the example of the invention being described, the eight bank chip is to be operated by the four bank controller 60 that produces only the two bank ID bits BA0 and BA1 in the bank ID field of the MRS. When operating with a four bank controller, the chip picks up one bit of the MRS, for example, address bit A14 for a 1 Gb size chip, at Activation (RAS) time. This bit is stored and used as the bank address BA2 bit. The chip circuits remembers the address bit (A14) together with the other bank ID bits BA0 and BA1. At read/write/precharge time, the BA2 bit (A14 from the row address in the example) is used as the BA2 bank address bit. The chip is provided with suitable circuits properly configured to accomplish this procedure.

The memory controller operates to ensure that all active banks are closed before refresh command or the memory controller uses a "precharge all" command to ensure the precharge condition before refresh.

Chart C illustrates the bank selection format of different controllers designed to be used with four and eight bank chips.

CHART C

4 Bank Chip, 4 Bank Controller, Read from Bank 3: I

| | | | |
|---|---|---|---|
| Act: | A14–A0 | BA0 = 1 BA1 = 1 | BA = "11" |
| Read: | A11, A9–A0 | BA0 = 1 BA1 = 1 | BA = "11" |

8 Bank Chip, 8 Bank Controller, Read from Bank 3: II

| | | | |
|---|---|---|---|
| Act: | A13–A0 | BA0 = 1 BA1 = 1 BA2 = 0 | BA = "011" |
| Read: | A11, A9–A0 | BA0 = 1 BA1 = 1 BA2 = 0 | BA = "011" |

8 Bank Chip Converted to Work With 4 Bank cmd/adr III

| | | | |
|---|---|---|---|
| Act: | A14–A0 (convert to 8 bank) | BA0 = 1 BA1 = 1 | BA = "11" |
| Act: | A13–A0 | BA0 = 1 BA1 = 1 | BA = "BA2,11" where BA2 = A14 |
| Read: | A11, A9–A0 (convert to 8 bank) | BA0 = 1 BA1 = 1 | BA = "11" |
| Read: | A11, A9–A0 | BA0 = 1 BA1 = 1 | BA = "BA2,11", where BA2 = A14 |

Section I of Chart C illustrates a four bank chip operating from a four bank controller in which a read command is to be executed. At the row activation (RAS) time the command/address includes the row address A14–A0 and the two bank ID bits having a digital value BA0=1 and BA1=1. Therefore, the bank ID is the digital number "11", to address bank 3 of the chip. This is the normal four bank operation from a four bank memory controller.

In Section II of Chart C an eight bank chip is operated by an eight bank controller. Again, Section II is a normal operation of eight bank operation from an eight bank controller in that there are three bank ID bits BA0, BA1, BA2. In Section II, BA0=1, BA1=1 and BA2=0 so that the bank ID address is 011 and bank 3 of the eight bank chip is selected. Note that the ROW address is one bit less than for the four bank chip of Section I due to the presence of the extra bank ID bit BA2.

Section III of Chart C illustrates the same eight bank chip of Section II operating with a four bank controller that produces the command addresses A0–A14, and the bank ID bits BA0 and BA1, each of a value digital 1. By design of the chip, the chip MRS mode control will be set to indicate that only a 4 bank external controller input will be available of the two bank ID bits BA0, BA1. The chip has bank conversion logic that latches one ROW address bit that is used as another bank ID bit, the BA2 bit in this example. By using three bank address bits BA0=1, BA1=1 and BA2=0 (Bit BA2 is address A14 at ROW address time) internally, the digital number value "011", or three, is produced and bank 3 of the chip is selected on an eight bank DRAM chip in response to instructions from a four bank external controller.

The latched value of A14 will be used as BA2 alone in any subsequent operation for the same ROW such as READ/WRITE commands or pre-charge command. Since subsequent commands on the same ROW are indicated by the BA0 and BA1 bank ID bits, and there are only four banks from the external memory controller point of view, implementation on the chip requires only four BA2 latches.

Figure 3:
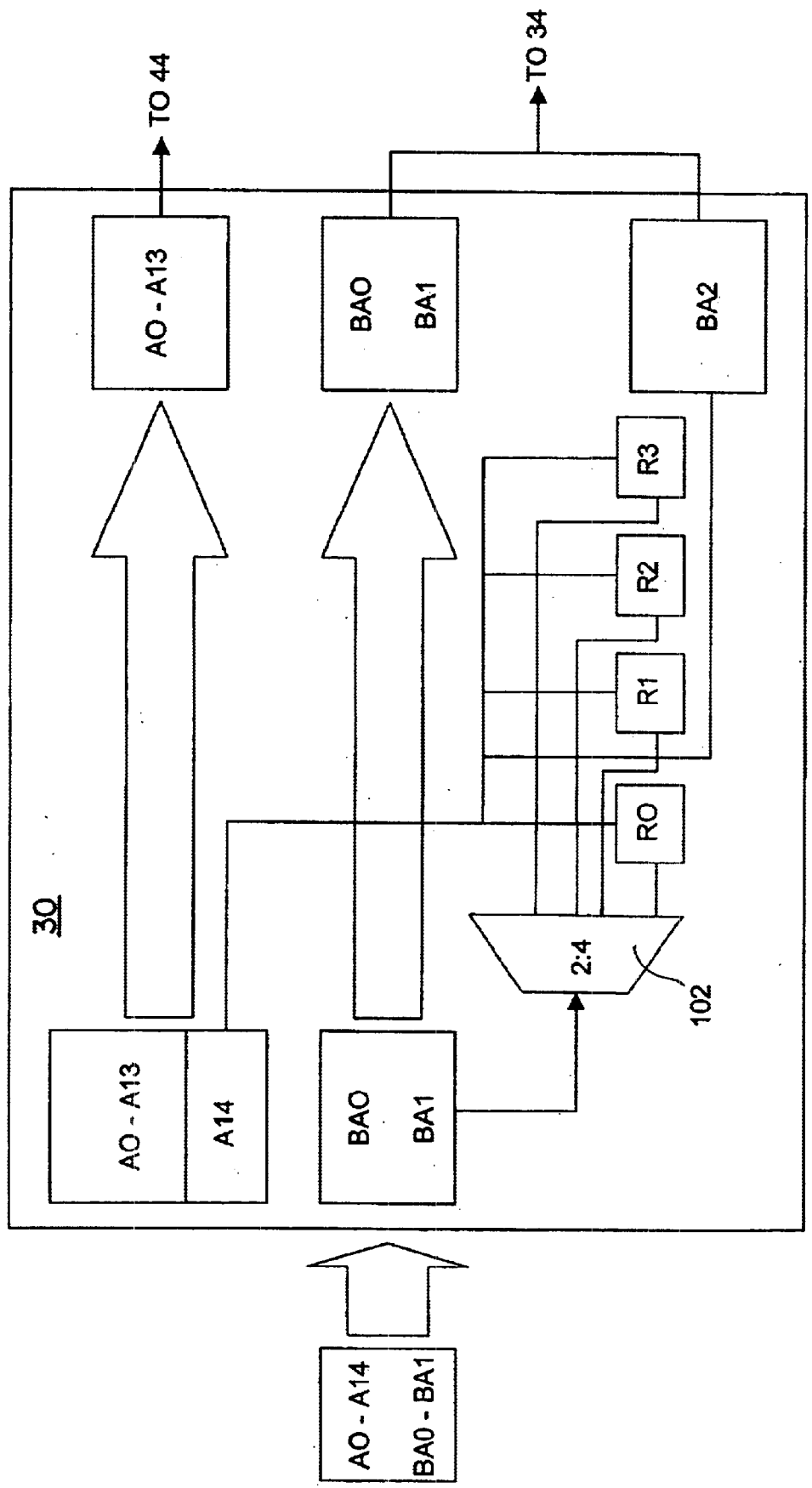
FIG. 3 is a schematic diagram of an eight bank chip operating with a four bank controller at the time of the bank Activate RAS command.

FIG. 3 is a diagram of the pertinent part of the chip circuitry for carrying out the invention such as illustrated in Section III of Chart C. FIG. 3 is in part a combination of the circuits of FIGS. 1 and 2 in which the address register 30 is used to provide the input address/bank ID for a chip 100 with eight banks, as in FIG. 2. FIG. 3 illustrates the chip address register 30 at the time of the activate (ACT) command. The control section 20, 22, 24, referring to FIGS. 1–2, provide the MRS of mode control bit, command decode logic, as well as DRAM control logic. In this case, the MRS mode will indicate that a four bank input to an eight bank DRAM internal is needed and the conversion logic of the chip 100 will operate. The conversion logic can be incorporated in the command register 30. This is explained below.

At the ACT command, address register 30 converts the input of address A14–A0 bits and bank ID bits BA0, BA1 to an output on the chip address bus of A0–A13 and BA0, BA1 and BA2 (from A14). The bits A0–A13, with the A14 bit stripped off, proceed directly to the row address multiplexer 44. The bank ID bits BA0, BA1 are applied to a 2:4 decoder 102 whose output is the latch "set" input to one of the four latches R0, R1, R2 and R3. Each of the latches R0, R1, R2 and R3 receives the A14 bit produced as instructed by the MRS 60. The bank ID bits BA0, BA1 along with BA2=A14 from one of the latches R0–R3 are applied to the bank address logic circuit 34 which selects the desired bank of the 8 banks 12-0 to 12-7.

Figure 4:
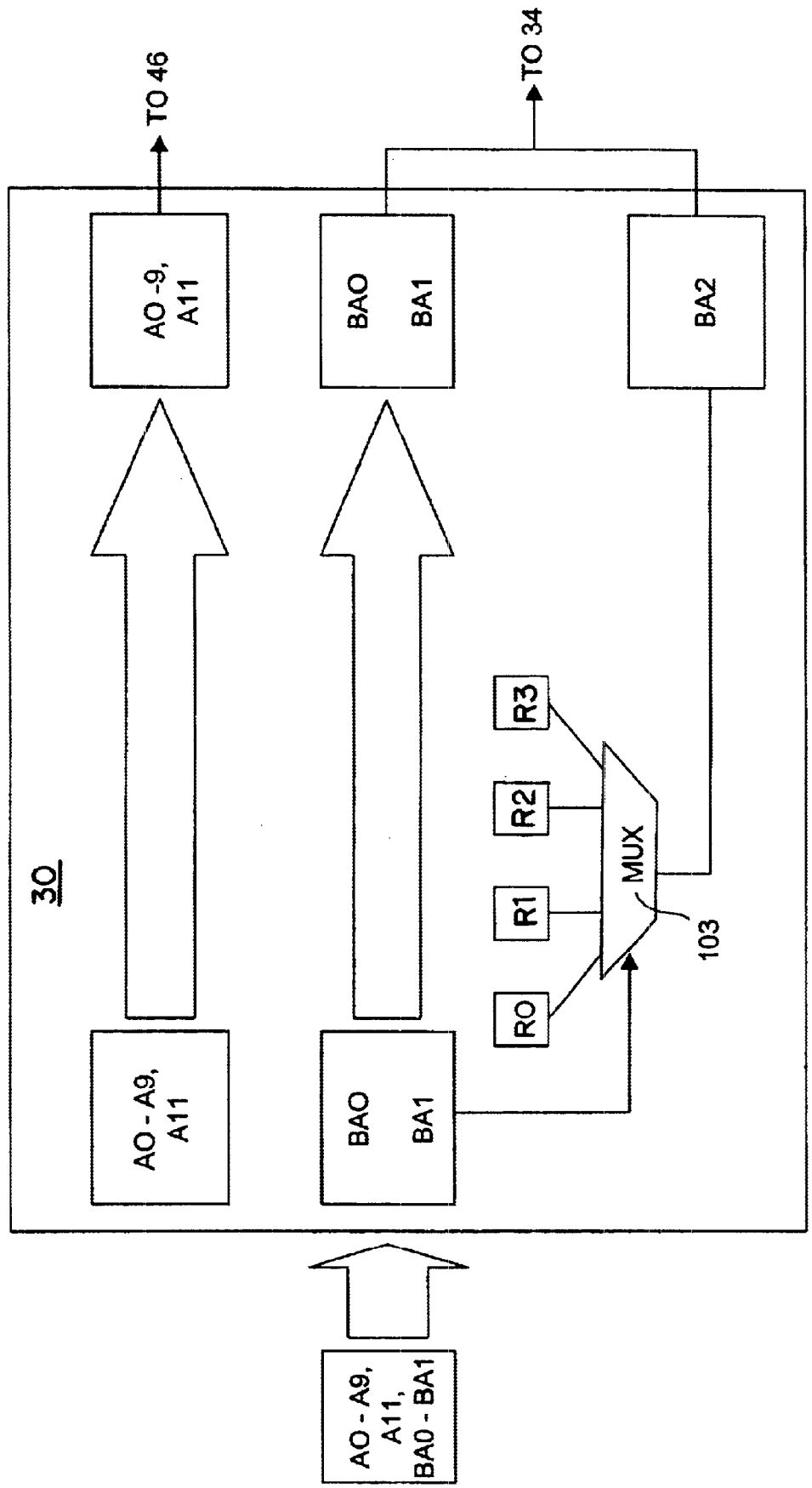
FIG. 4 is a schematic diagram of an eight bank chip operating with a four bank controller at the time of the bank read/write and precharge command.

FIG. 4 shows the column activate command set (CAS) in which the address register receives A0–A9, A11 and the two bank ID bits BA0, BA1. The chip logic of register 30 sends address bits A9–A0 and A11 as is to the Column address logic circuit 46. A multiplexer 103 (MUX) produces the bank ID bit BA2 of the latched A14 value from one of the four latches R0, R1, R2, R3 by using the decode BA0 and BA1 as the control. The bank ID bits BA0, BA1 and BA2 are applied to the bank address logic circuit 34 to select the desired bank of the eight memory banks.

While the invention has been described with respect to using one of the row address bits as the additional bank ID bit, a column address bit also can be used if the chip logic is appropriately designed. Also, while the invention has been described with respect to operating a chip having eight memory banks from an external controller designed to operate a chip with four memory banks, the invention can be extended in accordance with the general formula $$2^{n+m}$$

where n=the number of bank ID bits of the MRS as produced in response to the commands from the external controller, and m=the number of row (or column) address bit(s) used as the additional bank ID bit(s).

Specific features of the invention are shown in one or more of the drawings for convenience only, as each feature may be combined with other features in accordance with the invention. Alternative embodiments will be recognized by those skilled in the art and are intended to be included within the scope of the claims.

I claim:

1. A memory chip comprising:
    a plurality of memory banks each containing a plurality of memory cells arranged in rows and columns;
    a mode register circuit responsive to commands from an external controller for producing a mode register set of bank identification bits, row address bits and column address bits to select a memory cell in one of said plurality of memory banks to provide a command function for said selected memory cell; and
    an address register receiving said bank identification bits and said row and column address bits and using at least one of said row address bits or said column address bits as an additional bank identification bit to increase the number of memory banks from which selection of one of said plurality of memory banks can be made.

2. A memory chip as claimed in claim 1 wherein said address register uses one of said row address bits as the additional bank identification bit.

3. A memory chip as claimed in claim 1 wherein said chip has eight memory banks and said mode register circuit produces two bank identification bits in response to the commands from the external controller to permit the selection of one of four memory banks and said additional bank identification bit produced by said address register permits the selection of one of eight memory banks on the chip.

4. A memory chip as claimed in claim 1 wherein said mode register set produces n bank identification bits, where n is an integer and said address register add one bank identification bit to make a total of $2^{n+1}$ banks to be selected.

5. A memory chip as claimed in claim 1 wherein one of said row or column address bits is used as a bank identification bit, and said address register further comprises:
    a plurality of latch circuits each receiving the said one of said row or column address bits; and
    a decoder for receiving the bank identification bits of said mode register set for selecting which of said plurality of latch circuits is to be latched to store said one of said row or column address bits during an activate command of said mode register set.

6. A memory chip as claimed in claim 5 wherein said address register further comprises:
    a multiplexer for receiving the bank identification bits of said mode register set and producing an output to select the latch circuit that is latched with the stored said one of said row or column address bits.

7. A memory chip as claimed in claim 1 having $2^{n+m}$ memory banks, where each of n and m is an integer, which operates from the external controller that produces the mode register set having n bank identification bits and said address register produces m additional bank identification bits.

8. A method for selecting a memory cell in a chip having a plurality of memory banks in each of which a plurality of memory cells are arranged in rows and columns when using an external controller that produces commands to operate a chip having a lesser number of memory banks, comprising the steps of:
    providing from said controller commands to produce a mode register set of bank identification bits corresponding to selection of one of said lesser number of memory banks, row address bits and column address bits; and
    using one of said row address bits or column address bits of said mode register set as an added bank identification bit to permit selection of one of said plurality of memory banks.

9. The method as claimed in claim 8 wherein one of said row address bits of said mode register set is used as said added bank identification bit.

* * * * *